United States Patent
Yasui et al.

(10) Patent No.: US 10,096,452 B2
(45) Date of Patent: Oct. 9, 2018

(54) DATA PROCESSING METHOD, CHARGED PARTICLE BEAM WRITING METHOD, AND CHARGED PARTICLE BEAM WRITING APPARATUS

(71) Applicant: NuFlare Technology, Inc., Yokohama-shi (JP)

(72) Inventors: Kenichi Yasui, Kawasaki (JP); Shigehiro Hara, Kawasaki (JP); Shinji Sakamoto, Yokohama (JP)

(73) Assignee: NuFlare Technology, Inc., Yokohama-shi (JP)

( * ) Notice: Subject to any disclaimer, the term of this patent is extended or adjusted under 35 U.S.C. 154(b) by 0 days.

(21) Appl. No.: 15/342,296

(22) Filed: Nov. 3, 2016

(65) Prior Publication Data

US 2017/0169994 A1    Jun. 15, 2017

(30) Foreign Application Priority Data

Dec. 10, 2015 (JP) ................................ 2015-241287

(51) Int. Cl.
*H01J 37/30* (2006.01)
*H01J 37/302* (2006.01)
*H01J 37/317* (2006.01)

(52) U.S. Cl.
CPC ...... *H01J 37/3026* (2013.01); *H01J 37/3175* (2013.01)

(58) Field of Classification Search
CPC ............... H01J 37/3026; H01J 37/3174; H01J 37/3175; G06F 17/50; G03F 7/20
See application file for complete search history.

(56) References Cited

U.S. PATENT DOCUMENTS 4,912,487 A     3/1990 Porter et al.
6,313,476 B1 *  11/2001 Shimizu ................. B82Y 10/00
                                                    250/492.22

(Continued)

FOREIGN PATENT DOCUMENTS

JP     5-90141          4/1993
JP     05090141 A  *   4/1993

(Continued)

OTHER PUBLICATIONS

Office Action dated Aug. 11, 2017 in Korea Patent Application No. 10-2016-0167519.

(Continued)

*Primary Examiner* — David E Smith
(74) *Attorney, Agent, or Firm* — Oblon, McClelland, Maier & Neustadt, L.L.P.

(57) ABSTRACT

In one embodiment, a data processing method is for creating write data from design data, and registering the write data into a writing apparatus. The method includes applying, to a plurality of pieces of first frame data into which first chip data of the design data is divided, a plurality of conversion processes to create the write data, and applying a plurality of pre-processes to a plurality of pieces of second frame data into which second chip data of the write data is divided, and registering the second chip data into the writing apparatus. The plurality of conversion processes and the plurality of pre-processes are each performed in a pipeline processing on a per-frame basis. The write data is registered into the writing apparatus on a per-chip basis, on a per-virtual chip basis, or on a per-frame basis. The virtual chip includes a plurality of chips combined together.

12 Claims, 5 Drawing Sheets

(56) References Cited

U.S. PATENT DOCUMENTS

| | | | | |
|---|---|---|---|---|
| 2008/0023655 A1* | 1/2008 | Sakamoto | ............. | B82Y 10/00 |
| | | | | 250/492.22 |
| 2011/0066271 A1* | 3/2011 | Anpo | ..................... | B82Y 10/00 |
| | | | | 700/103 |
| 2011/0291029 A1* | 12/2011 | Yashima | ................ | B82Y 10/00 |
| | | | | 250/492.3 |

FOREIGN PATENT DOCUMENTS

| | | | |
|---|---|---|---|
| JP | 2006-277727 | | 10/2006 |
| JP | 2006-318977 A | | 11/2006 |
| JP | 2008-34439 | | 2/2008 |
| JP | 2009-81340 A | | 4/2009 |
| JP | 2009-271830 | | 11/2009 |
| JP | 2010-73854 | | 4/2010 |
| JP | 2010-267907 A | | 11/2010 |
| JP | 2010267907 A | * | 11/2010 |
| JP | 2013-190787 | | 9/2013 |
| TW | 201129795 A1 | | 9/2011 |

OTHER PUBLICATIONS

Combined Taiwanese Office Action and Search Report dated Nov. 20, 2017 in Patent Application No. 105139483 (with English translation of categories of cited documents).

* cited by examiner

Registered-Chip List

```
# Chip name: Check File
[Chip1]
   val_file="Chip1_val_1"
   :
```

Fig. 4B

Registered-Chip List

```
# Chip name: Check File
[Chip1]
   val_file="Chip1_val_1"
   :
[Chip2]
   val_file="Chip2_val_1"
   :
```

Fig. 5A

Layout Registration List

```
#<Layout Name>:<Chip Preparation Status>
Layout1: Completed(2/2)
```

Fig. 5B

Layout Registration List

```
#<Layout Name>:<Chip Preparation Status>
Layout1: Not Completed(1/2)
```

Fig. 6A

Required-Chip List

```
#<chip_dir>:<status>
Chip1: Completed
Chip2: Completed
```

Fig. 6B

Required-Chip List

```
#<chip_dir>:<status>
Chip1: Completed
Chip2: Not Completed
```

Fig. 10

DATA PROCESSING METHOD, CHARGED PARTICLE BEAM WRITING METHOD, AND CHARGED PARTICLE BEAM WRITING APPARATUS

CROSS REFERENCE TO RELATED APPLICATION

This application is based upon and claims benefit of priority from the Japanese Patent Application No. 2015-241287, filed on Dec. 10, 2015, the entire contents of which are incorporated herein by reference.

FIELD

The present invention relates to a data processing method, a charged particle beam writing method, and a charged particle beam writing apparatus.

BACKGROUND

The increasing integration of LSIs has led to finer and finer circuit line widths of semiconductor devices. An approach employed to form desired circuit patterns on semiconductor devices uses a step-and-repeat exposure system to reduce and transfer, onto a wafer, a high-precision master pattern (also called a mask, or a reticle particularly when used in a stepper or scanner) formed on a piece of quartz. The high-precision original pattern is written with an electron beam writing apparatus by use of a so-called electron beam lithography technique.

Processes such as fracturing and format conversion suitable for an electron beam writing apparatus are applied to design data (CAD data) outside the writing apparatus (in an external apparatus), thus creating write data based on the format used for the writing apparatus. The write data is transferred/input to the writing apparatus, and undergoes a data registration process including multiple stages of processing, such as format check and calculation of shot density.

Design data and write data each have a plurality of pieces of chip data including information such as chip structure, and layout data including information such as where individual chips are placed. The chip data is divided into a plurality of frames, and processes such as data conversion in an external apparatus and data registration in the writing apparatus are executed in a pipeline processing to improve processing speed.

In related art, write data is registered (input) into the writing apparatus on a per-layout basis. Data registration in the writing apparatus is started after all of chip data and layout data have been processed in the external apparatus. This makes it difficult to reduce the turn-around time (TAT) of the writing process.

DETAILED DESCRIPTION

In one embodiment, a data processing method is for creating write data from design data, and registering the write data into a charged particle beam writing apparatus. The data processing method includes applying, to a plurality of pieces of first frame data into which first chip data of the design data is divided, a plurality of conversion processes to create the write data, and applying a plurality of pre-processes to a plurality of pieces of second frame data into which second chip data of the write data is divided, and registering the second chip data into the charged particle beam writing apparatus. The plurality of conversion processes and the plurality of pre-processes are each performed in a pipeline processing on a per-frame basis. The write data is registered into the charged particle beam writing apparatus on a per-chip basis, on a per-virtual chip basis, or on a per-frame basis, the virtual chip including a plurality of chips combined together.

An embodiment of the present invention will be described below with reference to the drawings.

Figure 1:
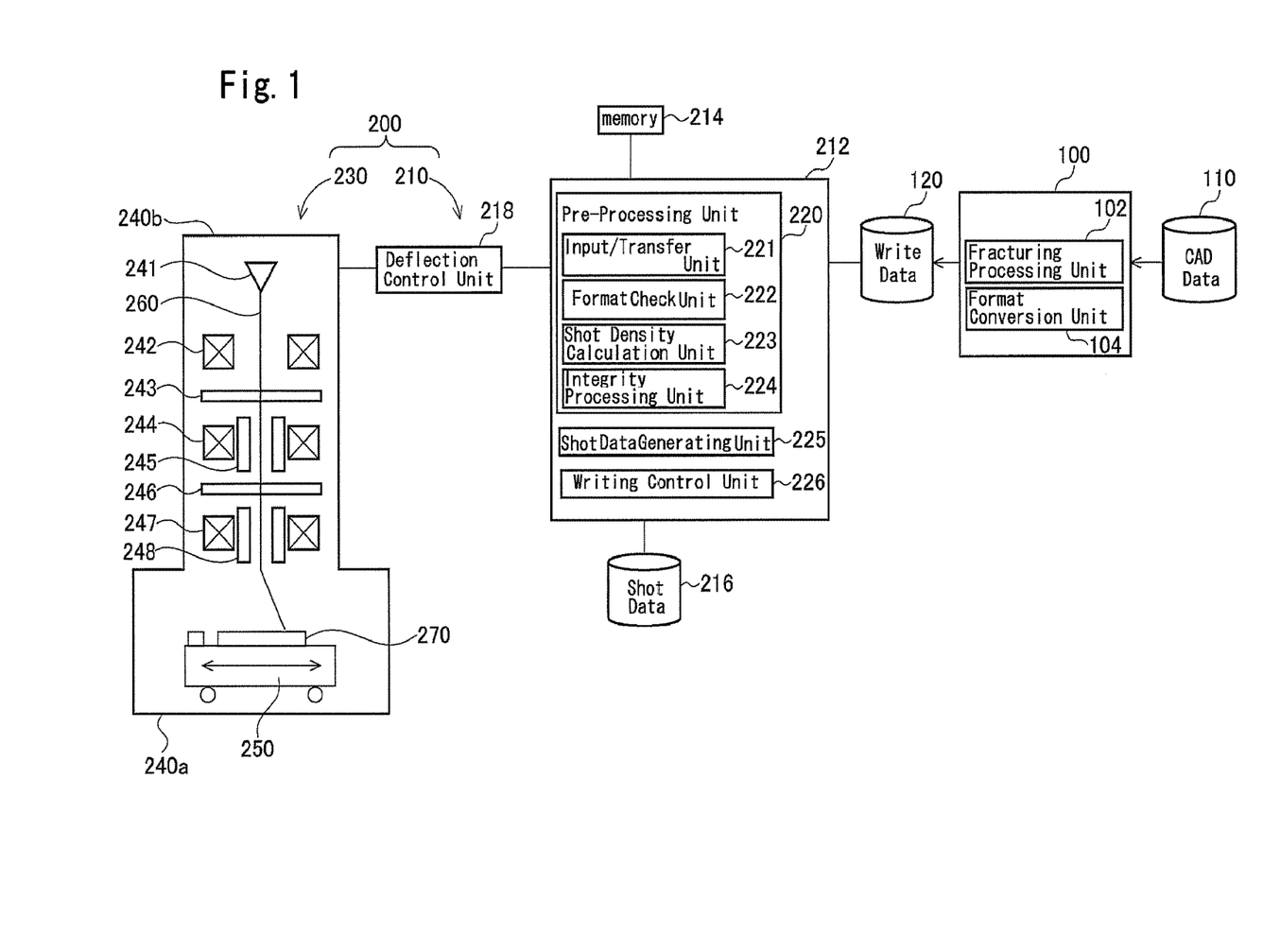
FIG. 1 illustrates a configuration of a writing system according to an embodiment of the present invention.

FIG. 1 is a conceptual diagram illustrating a configuration of a writing system according to the embodiment. The writing system includes a conversion apparatus 100 and a writing apparatus 200.

The writing apparatus 200 includes a control unit 210 and a writing unit 230. The writing apparatus 200 is an example of a charged particle beam writing apparatus. In particular, the writing apparatus 200 is an example of a writing apparatus of a variable-shaping type. The writing unit 230 includes a write chamber 240a, an electronic lens barrel 240b, an XY stage 250, an electron gun 241, an illumination lens 242, a first shaping aperture 243, a projection lens 244, a deflector 245, a second shaping aperture 246, an objective lens 247, and a deflector 248. A mask substrate 270, which is the object to be written to during the writing process, is disposed on the XY stage 250.

In the writing unit 230, the mask substrate 270, which is the object to be written to, is accommodated in the write chamber 240a, and the electronic lens barrel 240b communicates with the write chamber 240a. The write chamber 240a functions as a vacuum chamber with air-tightness. The electronic lens barrel 240b is disposed on top of the write chamber 240a to shape and deflect an electron beam by use of an optical system, and direct the resulting beam onto the mask substrate 270 located inside the write chamber 240a. At this time, the interior of each of the write chamber 240a and the electronic lens barrel 240b is decompressed to a vacuum.

The stage 250 is disposed inside the write chamber 240a to support the mask substrate 270. The stage 250 is movable in a horizontal plane in the X-axis direction and Y-axis direction (to be simply referred to as X-direction and Y-direction hereinafter) that are orthogonal to each other. The following components are disposed inside the electronic lens barrel 240b: the emitting unit 241 that emits an electron beam 260, such as an electron gun, the illumination lens 242 that collects the electron beam 260, the first shaping aperture 243 used for beam shaping, the projection lens 244 used for projection, the shaping deflector 245 used for beam shaping, the second shaping aperture 246 used for beam shaping, the objective lens 247 that brings the beam to a focus on the mask substrate 270, and the deflector 248 used to control the shot position of the beam on the mask substrate 270.

In the writing unit 230, the electron beam 260 is emitted from the emitting unit 241, and directed into the first shaping aperture 243 by the illumination lens 242. The first shaping aperture 243 has, for example, a rectangular opening. Thus, as the electron beam 260 passes through the first shaping aperture 243, the electron beam 260 is shaped to have a rectangular cross-section, and the resulting electron beam 260 is projected through the second shaping aperture 246 by the projection lens 244. The projected position can be deflected by the shaping deflector 245. Changing the projected position allows for control of the shape and dimensions of the electron beam 260. Then, upon passing through the second shaping aperture 246, the electron beam 260 is directed and focused by the objective lens 247 onto the mask substrate 270 placed on the stage 250. At this time, the shot position of the electron beam 260 on the mask substrate 270 placed on the stage 250 can be changed by the deflector 248.

The control unit 210 includes a control calculator 212, a memory 214, a storage device 216 such as a magnetic disc, and a deflection control unit 218. The control calculator 212 has a pre-processing unit 220, a shot data generating unit 225, and a writing control unit 226. The pre-processing unit 220 includes an input/transfer unit 221, a format check unit 222, a shot density calculation unit 223, and an integrity processing unit 224.

Functions such as the pre-processing unit 220, the shot data generating unit 225, and the writing control unit 226 may be each implemented by hardware such as an electrical circuit, or may be implemented by software that execute these functions. Data such as data input to and output from the pre-processing unit 220, the shot data generating unit 225, and the writing control unit 226, or mid-calculation data is stored into the memory 214 on an as-needed basis. The storage device 216 stores shot data generated by the shot data generating unit 225.

The shot data generating unit 225 splits a write pattern, which is defined in write data registered by a method described later, into a plurality of stripe regions (with its longitudinal direction aligned with the X-direction and the lateral direction aligned with the Y-direction) in the shape of stripes (rectangles). The shot data generating unit 225 further splits each stripe region into a large number of sub-regions in matrix form. In addition, the shot data generating unit 225 determines the shape, size, position, or other features of each geometric figure within each sub-region. Further, if it is impossible to write a geometric figure with a single shot, the shot data generating unit 225 splits the sub-region into a plurality of partial regions that can be written, and generates shot data. Information such as geometric figure type, geometric figure size, irradiation position, and dosage (or dose modulation amount) is defined for the shot data.

In writing a pattern, the writing control unit 226 causes the stage 250 to move in the longitudinal direction (X-direction) of the stripe regions, and causes the electron beam 260 to be shot onto a predetermined position by the deflector 248 to write a geometric figure. Then, once writing of one stripe region is completed, the writing control unit 226 causes the stage 250 to be moved stepwise in the Y-direction before writing to the next stripe region. This process is repeated until the entire writing region of the mask substrate 270 is written with the electron beam 260. The writing control unit 226 outputs a control signal based on shot data to the deflection control unit 218 to control how the electron beam 260 is deflected by the shaping deflector 245 and the deflector 248.

The conversion apparatus 100 has a fracturing processing unit 102 and a format conversion unit 104. The conversion apparatus 100 processes design data (CAD) stored in a storage device 110 to convert the data, thus creating write data. The created write data is stored into a storage device 120.

Design data includes layout data including information such as chip placement position, and chip data about each of a plurality of chips included in the layout. The design data is created by, for example, the designer of the semiconductor integrated circuit. The write data is provided in a format that allows it to be input to the writing apparatus 200. Examples of the storage devices 110 and 120 that can be used include magnetic disc devices or semiconductor disc devices (flash memories).

Design data typically includes a large number of minute patterns (such as geometric figures), and thus has a large data size. Write data created by converting this design data has an even larger data size. For this reason, data size is compressed by layering data in a hierarchical structure.

Figure 2:
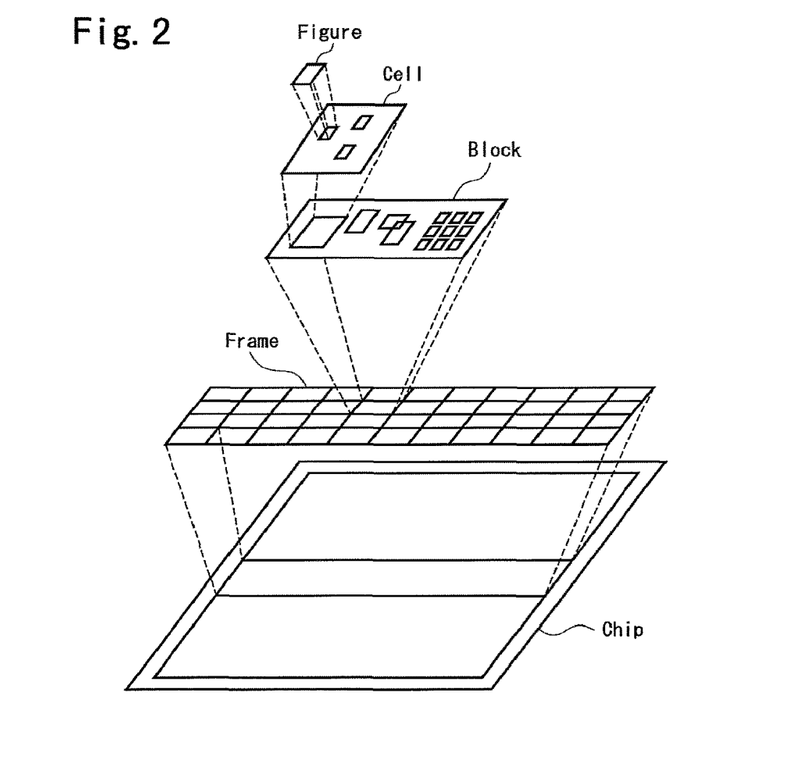
FIG. 2 illustrates a hierarchical structure of data.

FIG. 2 illustrates an example of the hierarchical structure of data. Design data includes a plurality of cells arranged on each chip. Each of the cells includes an arrangement of geometric figures constituting patterns that make up the cell. For write data, as illustrated in FIG. 2, the writing region is hierarchically layered in a series of a plurality of internal structural units at the following levels: chips, frames, which are obtained by dividing a chip region in, for example, the y-direction into a plurality of virtual regions with a rectangular shape, blocks, which are obtained by dividing a frame region into regions of a predetermined size, cells, which are included in a block, and geometric figures, which constitute patterns that make up a cell.

Design data includes patterns of various shapes, such as polygonal geometric figures. The fracturing processing unit 102 of the conversion apparatus 100 breaks up these geometric figures into a plurality of types of trapezoids that can be input to the writing apparatus 200. The format conversion unit 104 converts the design data into a format suitable for the writing apparatus 200.

Each chip data of the design data is divided into frame units, and made up of data files on a per-frame basis. Processes including fracturing performed by the fracturing processing unit 102, and format conversion performed by the format conversion unit 104 are executed in a pipeline processing on a per-frame basis. The conversion apparatus 100 generates write data on a frame-by-frame basis.

The input/transfer unit 221 of the pre-processing unit 220 of the writing apparatus 200 receives input (transfer) of a write data file from the storage device 120. As a format check, the format check unit 222 performs, for example, a parity check on a frame-by-frame basis.

The shot density calculation unit 223 calculates shot density, which represents the number of shots per unit area (or per unit time during the writing process), on a frame-by-frame basis. Processes in the input/transfer unit 221, the format check unit 222, and the shot density calculation unit 223 are executed in a pipeline processing on a per-frame basis.

The integrity processing unit 224 performs integrity processing, such as processes that can be successfully executed only when all of layout data and chip data are available, a parameter change check based on integrity information described later, and checksum verification. Examples of processes that can be successfully executed only when all of layout data and chip data are available include a determination of whether chips fit in a mask. Although layout data includes information on where chips are to be placed, information on chip size is included not in the layout data but in chip data. The integrity processing unit 224 determines whether chips fit in a mask, from information on chip placement position included in layout data, and chip size information included in chip data.

In this embodiment, write data (chip data) is registered into the writing apparatus 200 on a per-chip basis. That is, when write data for a single chip is created in the conversion apparatus 100, the write data for a single chip is registered into the writing apparatus 200.

Figure 3:
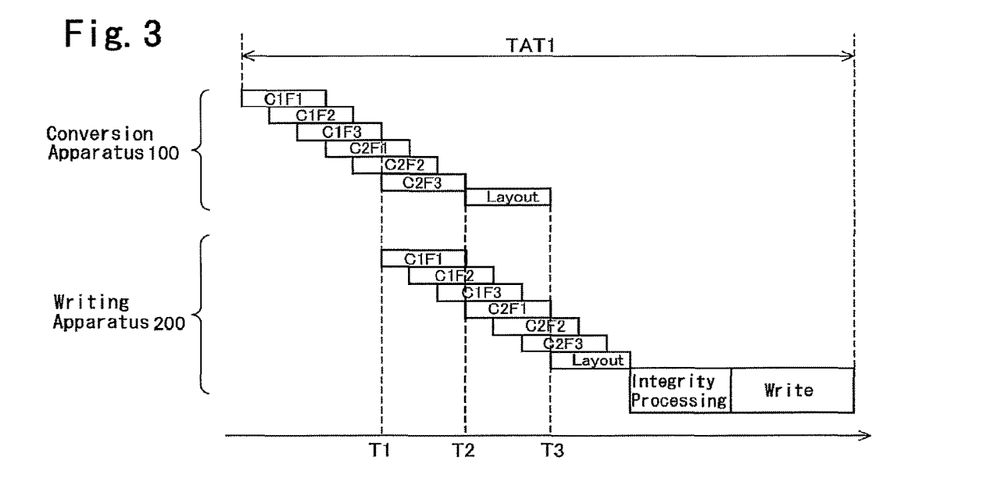
FIG. 3 illustrates an example of data processing according to the embodiment.

FIG. 3 illustrates an example of data processing executed by the conversion apparatus 100 and the writing apparatus 200. The arrangement in FIG. 3 assumes that the mask includes two chips C1 and C2, and the chip data of each of the chips C1 and C2 is virtually divided into three frames F1 to F3. For example, "C1F1" in FIG. 3 indicates chip data corresponding to the frame F1 of the chip C1.

The conversion apparatus 100 performs fracturing and format conversion such that these processes are executed in a pipeline processing in the following order: the frames F1, F2, and F3 of the chip C1 and then the frames F1, F2, and F3 of the chip C2.

Once processing for the frame F3 of the chip C1 is finished in the conversion apparatus 100, and write data for the chip C1 is created (time T1 in FIG. 3), the pre-processing unit 220 of the writing apparatus 200 performs data transfer, format check, and shot density calculation such that these processes are executed in a pipeline processing on a per-frame basis in the order of the frames F1, F2, and F3 of the chip C1.

A parameter file, which describes parameters required in processing the chip data of the chip C1 in the writing apparatus 200 is prepared in advance, and registered in the writing apparatus 200. The parameter file includes information such as mesh size used for area calculation, and maximum shot size used for shot count calculation. The parameter file may be input to the writing apparatus 200 together with chip data.

In registering chip data and parameter file for the chip C1 into the writing apparatus 200, a layout name is specified for (input to) the writing apparatus 200. The specified layout name is used as the name of a directory for storing data related to the corresponding layout in a storage device (not illustrated) of the writing apparatus 200. Data such as the registered chip data or layout data is stored in this directory.

Figure 4A:
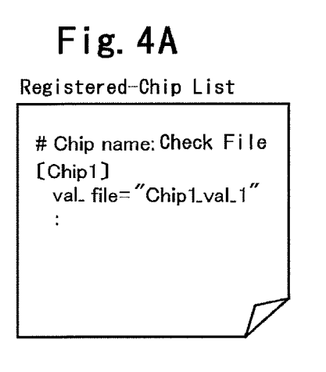
FIGS. 4A and 4B each illustrate an example of a registered-chip list.

Once processes such as data transfer, format check, and shot density calculation for the chip data of the chip C1 are successfully finished, the pre-processing unit 220 creates integrity information, and a registered-chip list illustrated in FIG. 4A, and registers the chip information of the chip C1 into this list. The chip information to be registered includes chip name and integrity information file name.

In this regard, integrity information refers to information such as check sum information of a file output during pipeline processing in the pre-processing unit 220, and information described in a parameter file. Integrity information is used for integrity processing executed by the integrity processing unit 224.

Once processing for the frame F3 of the chip C2 is finished in the conversion apparatus 100, and write data for the chip C2 is created (time T2 in FIG. 3), the pre-processing unit 220 of the writing apparatus 200 performs data transfer (reception of input), format check, and shot density calculation such that these processes are executed in a pipeline processing in the order of the frames F1, F2, and F3 of the chip C2.

As with the chip C1, a parameter file describing parameters required in processing the chip data of the chip C2 in the writing apparatus 200 is prepared in advance, and registered in the writing apparatus 200.

Figure 4B:
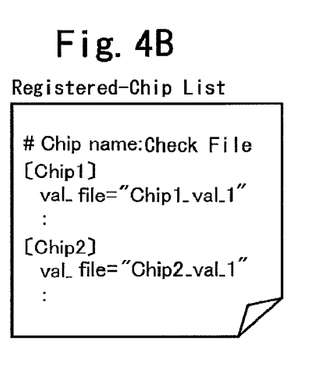

Once processes such as data transfer, format check, and shot density calculation for the chip data of the chip C2 are successfully finished, the pre-processing unit 220 creates integrity information, and as illustrated in FIG. 4B, the pre-processing unit 220 registers the chip information of the chip C2 into the registered-chip list.

Once processing for the frame F3 of the chip C2 is finished in the conversion apparatus 100, data processing is performed for layout data. Once the layout data is processed in the conversion apparatus 100 (time T3 in FIG. 3), the layout data is registered into the writing apparatus 200.

Figure 5A:
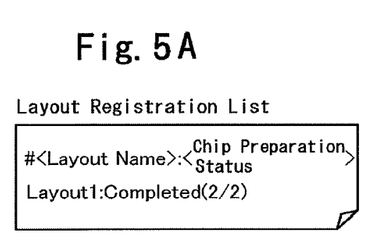
FIGS. 5A and 5B each illustrate an example of a layout registration list.

The writing apparatus 200 has a layout registration list as illustrated in FIG. 5A. In response to registration of layout data, the name of the corresponding layout and chip preparation status are recorded into the layout registration list. The chip preparation status indicates whether chip data for all of the chips included in the layout has been registered.

Figure 6A:
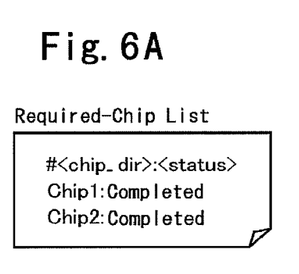
FIGS. 6A and 6B each illustrate an example of a required-chip list.

The pre-processing unit 220 creates, in response to registration of layout data, a required-chip list as illustrated in FIG. 6A that lists chips included in the corresponding layout. The pre-processing unit 220 refers to the registered-chip list illustrated in FIG. 4A or 4B to record, for each chip, information indicating whether registration of chip data is completed for the chip.

In the example illustrated in FIG. 3, layout data is registered after processing of the chip data of each of the chips C1 and C2 is completed. Thus, for both the chips C1 and C2, information indicating that the registration process is "Completed" is recorded as illustrated in FIG. 6A. At this time, chip data for all of the chips (the chips C1 and C2) has been registered. Thus, as illustrated in FIG. 5A, the chip preparation status in the layout registration list is recoded as "Completed (2/2)", which indicates that registration is completed.

In the example illustrated in FIG. 3, layout data is processed after all of chip data have been processed in the conversion apparatus 100 and the writing apparatus 200. However, processing of layout data may not be performed last. For example, processing of layout data may be performed after the chip data of the chip C1 is processed and before the chip data of the chip C2 is processed.

Figure 5B:
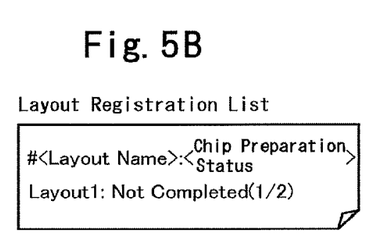
Figure 6B:
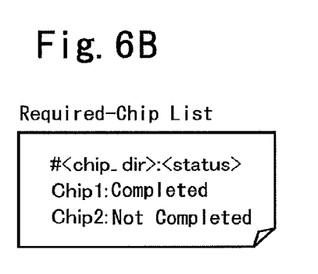

In this case, at the time when registration of layout data is performed in the pre-processing unit 220, registration of the chip data of the chip C1 is completed, whereas registration of the chip data of the chip C2 is not completed. Thus, as illustrated in FIG. 6B, information indicating that registration is "Completed" for the chip C1, and information indicating that registration is "Not Completed" for the chip C2 are recorded in the required-chip list. Further, as illustrated in FIG. 5B, the chip preparation status in the layout registration list is recoded as "Not Completed (1/2)", which indicates that registration is completed for only one of a total of two chips. Thereafter, once the pre-processing unit 220 completes registration of the chip data of the chip C2, the required-chip list changes from the state illustrated in FIG. 6B to the state illustrated in FIG. 6A, and the layout registration list changes from the state illustrated in FIG. 5B to the state illustrated in FIG. 5A.

When the chip preparation status in the layout registration list becomes "Completed", the name of the corresponding layout is displayed on the job screen (not illustrated) of the writing apparatus 200 to allow the layout to be selected by the user. When the user selects the layout, and registers the layout as a job (instructs to start writing), the integrity processing unit 224 performs processes that can be successfully executed only when all of layout data and chip data are available, or performs processes such as a parameter change check or checksum verification based on integrity information corresponding to an integrity information file name described in the registered-chip list. If the checksum verification detects an error, the pipeline processing in the pre-processing unit 220 is performed again on a per-chip basis.

After integrity processing is performed by the integrity processing unit 224, writing to the mask substrate 270 by the writing unit 230 is performed.

Comparative Example

Figure 7:
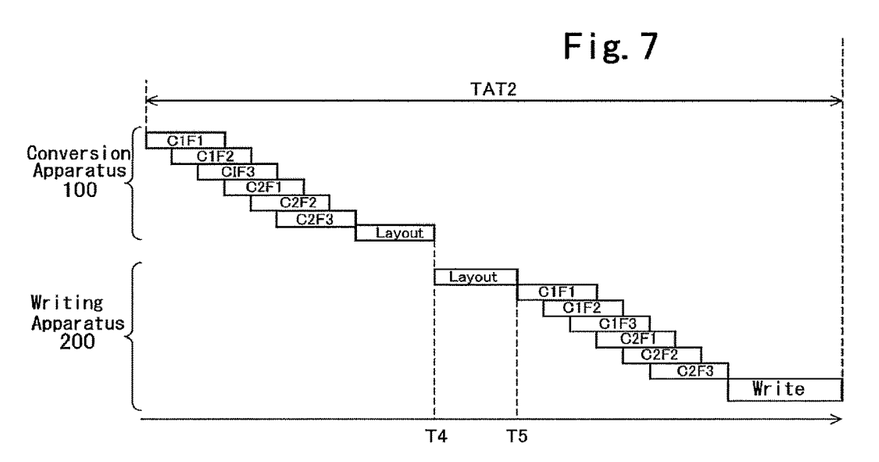
FIG. 7 illustrates an example of data processing according to a comparative example.

FIG. 7 illustrates an example of data processing for when write data (chip data) is registered into the writing apparatus 200 on a per-layout basis. As with the example illustrated in FIG. 3, it is assumed that the mask includes two chips C1 and C2, and the chip data of each of the chips C1 and C2 is divided into three frames F1 to F3.

First, the conversion apparatus 100 performs fracturing and format conversion such that these processes are executed in a pipeline processing in the following order: the frames F1, F2, and F3 of the chip C1 and then the frames F1, F2, and F3 of the chip C2. Then, once processing for the frame F3 of the chip C2 is finished, data processing is performed for layout data.

Once the layout data is processed in the conversion apparatus 100, registration of data into the writing apparatus 200 is started (time T4 in FIG. 7), and the layout data is registered into the writing apparatus 200. Once the layout data is registered (time T5 in FIG. 7), the writing apparatus 200 performs data transfer, format check, and shot density calculation such that these processes are executed in a pipeline processing in the order of the frames F1, F2, and F3 of the chip C1 and then the frames F1, F2, and F3 of the chip C2. Thereafter, writing to the mask substrate 270 by the writing unit 230 is performed. In the comparative example, layout data is registered into the writing apparatus 200 first, and thus integrity processing such as that in the above-mentioned embodiment is not performed.

If write data (chip data) is registered on a per-layout basis as in the case of data processing according to the comparative example, registration of data into the writing apparatus 200 is started after processing of all data is completed in the conversion apparatus 100. This leads to increased TAT of the writing process (TAT2 in FIG. 7).

By contrast, in the embodiment mentioned above, registration of write data into the writing apparatus 200 is performed on a per-chip basis. For example, as illustrated in FIG. 3, when processing for the frame F3 of the chip C1 is finished, and write data of the chip C1 is created, the chip data of the chip C1 is registered into the writing apparatus 200. Thus, the TAT (TAT1 in FIG. 3) of the writing process can be made shorter than the TAT (TAT2) in the comparative example.

For example, suppose that the layout include five chips, each chip is divided into 200 frames, the processing time of each frame is 30 seconds, the layout processing time is 10 minutes, the actual write time by the writing unit 230 is eight hours, and the time required for the integrity processing is 30 minutes. In this case, registering write data on a per-chip basis as in the embodiment results in a TAT of 18.5 hours. By contrast, registering write data on a per-layout basis as in the comparative example results in a TAT of 25 hours. The approach according to the embodiment can thus reduce TAT by approximately 25% relative to the comparative example.

Figure 8:
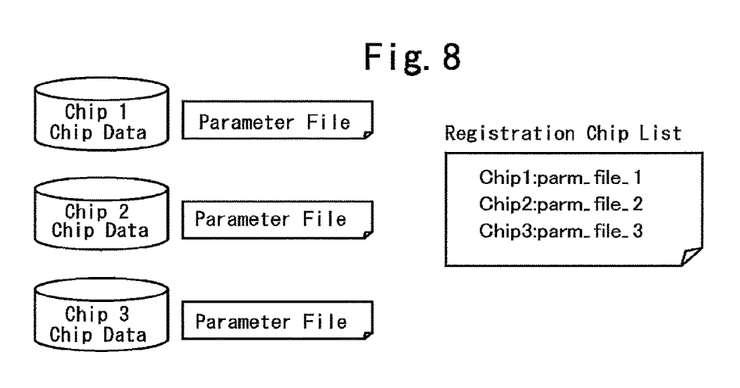
FIG. 8 illustrates an example of a registration chip list.

An alternative approach may be employed that involves preparing a registration chip list as illustrated in FIG. 8 that collectively describes a plurality of chips whose chip data is to be registered into the writing apparatus 200, and specifying this registration chip list as an input when registering chip data into the writing apparatus 200, thus allowing a plurality of pieces of chip data to be registered (automatically) in succession.

The registration chip list describes information such as chip name, chip data storage directory path, and parameter file path for each chip. The registration chip list may additionally describe information such as the coordinates where chips are placed on the mask, the relative coordinates of chips, and which chips are to be merged.

Although the embodiment mentioned above is directed to a case in which chip data is registered into the writing apparatus 200 on a chip level, chip data may be registered on any level higher than the layout level, for example, on a virtual chip level where a virtual chip is made up of a plurality of chips combined together, or on a frame level lower than the chip level.

Figure 9:
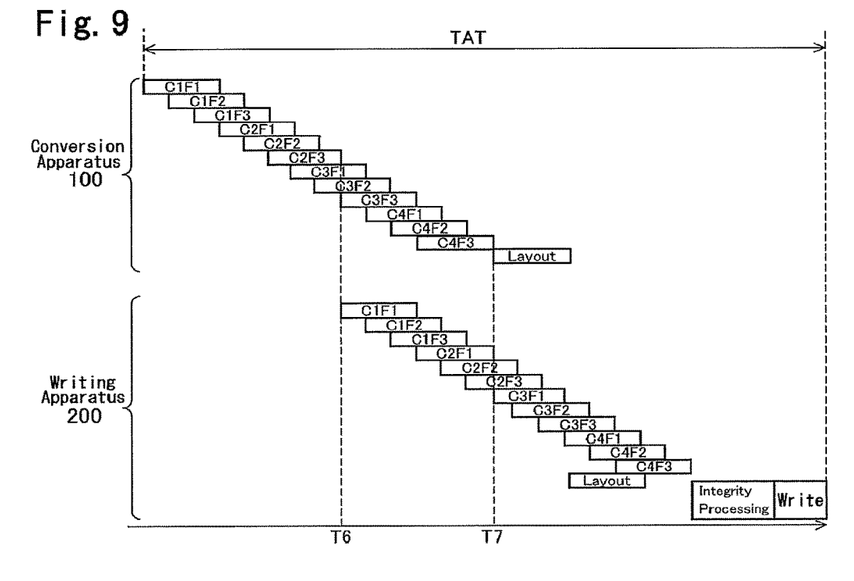
FIG. 9 illustrates an example of data processing according to a modification.

FIG. 9 illustrates an example of data processing in the conversion apparatus 100 and the writing apparatus 200 for when chip data is registered on a per-virtual chip basis. The example illustrated in FIG. 9 assumes that the mask includes four chips C1 to C4, the chip data of each of the chips C1 to C4 is divided into three frames F1 to F3, and two chips are combined into a virtual chip.

The conversion apparatus 100 performs fracturing and format conversion such that these processes are executed in a pipeline processing in the following order: the frames F1, F2, and F3 of the chip C1, the frames F1, F2, and F3 of the chip C2, the frames F1, F2, and F3 of the chip C3, and then the frames F1, F2, and F3 of the chip C4.

Once processing for the frame F3 of the chip C2 is finished in the conversion apparatus 100, and write data for each of the chips C1 and chip C2 is created (time T6 in FIG. 9), the pre-processing unit 220 of the writing apparatus 200 performs data transfer, format check, and shot density calculation such that these processes are executed in a pipeline processing on a per-frame basis in the order of the frames F1, F2, and F3 of the chip C1 and then the frames F1, F2, and F3 of the chip C2.

Then, when processing for the frame F3 of the chip C4 is finished in the conversion apparatus 100, and write data for each of the chips C3 and C4 is created (time T7 in FIG. 9), the pre-processing unit 220 of the writing apparatus 200 performs reception of input, format check, and shot density calculation such that these processes are executed in a pipeline processing in the order of the frames F1, F2, and F3 of the chip C3 and then the frames F1, F2, and F3 of the chip C4.

Registering chip data on a per-virtual chip basis in this way also makes it possible to reduce the TAT of the writing process relative to when chip data is registered on a per-layout basis as in the comparative example mentioned above.

Figure 10:
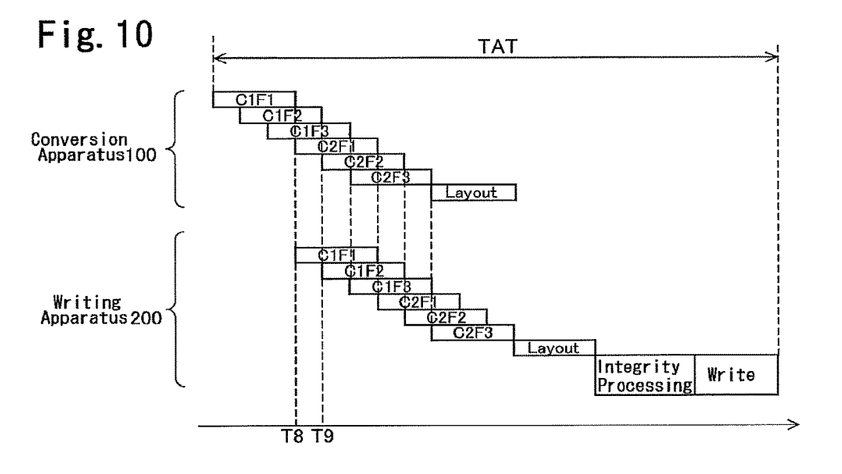
FIG. 10 illustrates an example of data processing according to a modification.

FIG. 10 illustrates an example of data processing in the conversion apparatus 100 and the writing apparatus 200 for when chip data is registered on a per-frame basis. The example illustrated in FIG. 10 assumes that the mask includes two chips C1 and C2, and the chip data of each of the chips C1 and C2 is divided into three frames F1 to F3.

The conversion apparatus 100 performs fracturing and frame conversion in a pipeline processing in the order of the frames F1, F2, and F3 of the first chip C1 and then the frames F1, F2, and F3 of the second chip C2.

Once processing for the frame F1 of the chip C1 is finished in the conversion apparatus 100, and write data for this frame is created (time T8 in FIG. 10), the pre-processing unit 220 of the writing apparatus 200 performs, for the frame F1 of the chip C1, data transfer, format check, and shot density calculation in the stated order.

Once processing for the frame F2 of the chip C1 is finished in the conversion apparatus 100, and write data for this frame is created (time T9 in FIG. 10), the pre-processing unit 220 of the writing apparatus 200 performs, for the frame F2 of the chip C1, data transfer, format check, and shot density calculation in the stated order. The data processing in the pre-processing unit 220 is performed in a pipeline processing in the order of the frames F1 and F2. Thereafter, likewise, once processing for one frame is finished in the conversion apparatus 100, the pre-processing unit 220 performs processing for this frame.

Registering chip data on a per-frame basis in this way also makes it possible to reduce the TAT of the writing process relative to when chip data is registered on a per-layout basis as in the comparative example mentioned above.

The writing apparatus according to the embodiment mentioned above may not be of a variable shaping type but may be a multi-beam writing apparatus. Although the embodiment mentioned above is directed to a case in which electron beams are used as an example of charged particle beams, the charged particle beams are not limited to electron beams but may be ion beams or other types of charged particle beams.

While certain embodiments have been described, these embodiments have been presented by way of example only, and are not intended to limit the scope of the inventions. Indeed, the novel methods and systems described herein may be embodied in a variety of other forms, furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A data processing method for creating write data from design data, and registering the write data into a charged particle beam writing apparatus, the data processing method comprising:

applying, to a plurality of pieces of first frame data into which first chip data of the design data is divided, a plurality of conversion processes to create the write data; and applying a plurality of pre-processes to a plurality of pieces of second frame data into which second chip data of the write data is divided, and registering the second chip data into the charged particle beam writing apparatus, wherein the plurality of conversion processes and the plurality of pre-processes are each performed in a pipeline processing on a per-frame basis, wherein the write data is registered into the charged particle beam writing apparatus on a per-chip basis, on a per-virtual chip basis, or on a per-frame basis, the virtual chip including a plurality of chips combined together, wherein after all of chip data and layout data of the write data are registered into the charged particle beam writing apparatus, integrity processing including processing that uses the chip data and the layout data is performed, and wherein a deflection of a charged particle beam in the charged particle beam writing apparatus is controlled by using data that has undergone the integrity processing.

2. The method according to claim 1, wherein the integrity processing includes determining whether chips fit in a mask, from information on chip placement position included in the layout data, and chip size information included in the chip data.

3. The method according to claim 1, wherein in response to registration of the layout data, a name of a layout, and a chip preparation status are recorded into a layout registration list, the chip preparation status indicating whether all of chips included in the layout have been registered.

4. The method according to claim 1, wherein the pre-processes include a format check and a calculation of shot density.

5. A charged particle beam writing apparatus into which write data is registered, the write data being created by an external apparatus by applying, in a pipeline processing, a plurality of conversion processes to a plurality of pieces of first frame data into which first chip data of design data is divided, the charged particle beam writing apparatus comprising:

a pre-processing circuitry applying, in a pipeline processing, a plurality of pre-processes to a plurality of pieces of second frame data into which second chip data of the write data is divided, registering the second chip data, and performing, after all of chip data and layout data of the write data are registered, integrity processing including processing that uses the chip data and the layout data; and a writer writing a pattern onto a substrate with a charged particle beam by using data processed by the pre-processing unit, wherein the write data is registered into the charged particle beam writing apparatus on a per-chip basis, on a per-virtual chip basis, or on a per-frame basis, the virtual chip including a plurality of chips combined together.

6. The apparatus according to claim 5, wherein as the integrity processing, the pre-processing circuitry determines whether chips fit in a mask, from information on chip placement position included in the layout data, and chip size information included in the chip data.

7. The apparatus according to claim 5, wherein in response to registration of the layout data, a name of a layout, and a chip preparation status are recorded into a layout registration list, the chip preparation status indicating whether all of chips included in the layout have been registered.

8. The apparatus according to claim 5, wherein as the pre-processes, the pre-processing circuitry performs a format check and a calculation of shot density.

9. A charged particle beam writing method using write data, the write data being created by an external apparatus by applying, in a pipeline processing, a plurality of conversion processes to a plurality of pieces of first frame data into which first chip data of design data is divided, the charged particle beam writing method comprising:
- applying, in a pipeline processing, a plurality of pre-processes to a plurality of pieces of second frame data into which second chip data of the write data is divided, and registering the second chip data into a charged particle beam writing apparatus;
- performing, after all of chip data and layout data of the write data are registered, integrity processing including processing that uses the chip data and the layout data; and
- writing a pattern onto a substrate with a charged particle beam by using data that has undergone the integrity processing,
- wherein the write data is registered into the charged particle beam writing apparatus on a per-chip basis, on a per-virtual chip basis, or on a per-frame basis, the virtual chip including a plurality of chips combined together.

10. The method according to claim 9, wherein the integrity processing includes determining whether chips fit in a mask, from information on chip placement position included in the layout data, and chip size information included in the chip data.

11. The method according to claim 9, wherein in response to registration of the layout data, a name of a layout, and a chip preparation status are recorded into a layout registration list, the chip preparation status indicating whether all of chips included in the layout have been registered.

12. The method according to claim 9, wherein the pre-processes include a format check and a calculation of shot density.

* * * * *